United States Patent [19]
Beard

[11] Patent Number: 4,882,585
[45] Date of Patent: Nov. 21, 1989

[54] METHOD AND APPARATUS FOR HIGH RESOLUTION ANALOG-DIGITAL-ANALOG TRANSFORMATIONS

[76] Inventor: Terry D. Beard, 1407 North View Dr., Westlake Village, Calif. 91362

[21] Appl. No.: 169,865

[22] Filed: Mar. 17, 1988

[51] Int. Cl.$^4$ .............................................. H03M 1/62
[52] U.S. Cl. .................................... 341/143; 341/106; 341/131; 341/110; 375/30
[58] Field of Search ............................ 375/30; 381/30; 341/106, 110, 118, 131, 143

[56] References Cited

U.S. PATENT DOCUMENTS

| | | | |
|---|---|---|---|
| 3,973,199 | 8/1976 | Widmer | 325/38 B |
| 4,130,729 | 12/1978 | Gagnon | 179/1 SA |
| 4,133,976 | 1/1979 | Atal et al. | 179/1 P |
| 4,385,393 | 5/1983 | Chaure et al. | 375/30 |
| 4,430,670 | 2/1984 | Netravali | 358/135 |
| 4,554,670 | 11/1985 | Aiko et al. | 375/30 |
| 4,592,070 | 5/1986 | Chow et al. | 375/30 |
| 4,700,362 | 10/1987 | Todd et al. | 381/29 |

OTHER PUBLICATIONS

Precision Monolithics, Inc., "Linear and Conversion Products 1986/1987 Data Book".

*Primary Examiner*—William M. Shoop, Jr.
*Assistant Examiner*—G. Romano
*Attorney, Agent, or Firm*—Koppel & Jacobs

[57] ABSTRACT

A method and system for encoding a series of input digital signals in a higher order digital format, such as 16 bit, to a series of lower order digital signals such as 8 bit, and then recovering the original input signals with a greater accuracy than previously attainable is described. A distinct reduction in quantization noise is produced, making the system compatible with very high resolution audio equipment such as compact disks. For each input signal, a particular pair of complementary encoding and decoding transformations are selected from a set of numerous possible transformations. The transformations are nonlinear, with high resolutions near the origin and much lower resolutions further away. The high resolution range increases from table to table, while the absolute resolution within said ranges decreases. The value of each input signal is predicted from previous signals, and a differential quantity representing the prediction error is used in selecting the table for each signal. Overall quantization noise is significantly reduced by updating the table selections so that the differential quantity remains within the high resolution range. Identical decoding circuitry is provided in both the encoder and decoder to assure tracking between the two. An analog-to-digital conversion is provided at the input, with a reverse conversion at the output.

20 Claims, 8 Drawing Sheets

METHOD AND APPARATUS FOR HIGH RESOLUTION ANALOG-DIGITAL-ANALOG TRANSFORMATIONS

BACKGROUND OF THE INVENTION

1. Field of the Invention

The present invention relates to a method and associated apparatus for encoding an analog signal into a digital form and for decoding the digital signal back into an analog form, wherein the encoding and decoding are performed in such a way as to maximize the useful dynamic range of the signal when used for encoding and decoding an audio signal.

2. Description of the Related Art

Digital encoding of analog signals is usually accomplished by what is called a "linear" conversion, in which a simple direct binary value equal to the analog value to be encoded is generated. For example, an 8 bit digital system would encode all input analog signal values into one of 256 values linearly related to the input analog value. The conversion of the input analog signal into its binary representation is accomplished by sampling the analog signal at a rate equal to at least twice the rate of the highest frequency component to be encoded within the analog signal, and converting the sampled analog values to the nearest digital representation. Because of the finite and limited number of representations possible using a binary number, the input signal is "quantized" and the representation at each sample may not accurately correspond to the associated analog value. For instance, if the encoding system is an 8 bit system, there are only 256 values possible, i.e., 0 through 255; or, more specifically in binary representation, 00000000 through 11111111. If the input analog value sampled were 128.438, for example, it would be represented by the nearest binary value, e.g., 1000000 or 128. The difference of 0.438 is an error often referred to as the "quantization error" or "quantization noise". When the analog signal being converted is an audio signal, this error is heard as noise when the signal is decoded back into its analog form. When the analog signal is large, the error represents only a small fraction of the overall signal value. When the signal is small, however, the error becomes much more significant. In fact, signals smaller than the quantization size can be lost entirely. Even for a large signal, the quantization noise will not be masked if low frequencies dominate.

One solution to this problem has been the use of nonlinear digital encoders/decoders, such as those produced by Precision Monolithics, Inc. under the trademark COMDAC. The principle of operation of the COMDAC encoders/decoders is to make the step size dependent on the signal amplitude. As a result, for small signals the quantization noise is smaller and, therefore, less objectionable. At the same time, the quantization noise for large signals is correspondingly larger, but is "masked" in the case of audio signals by the large signal itself. While the performance of the COMDAC device is acceptable for some uses, the general approach is inadequate for high fidelity audio use.

In a related patent application by the present inventor, entitled "Audio Digital/Analog Encoding and Decoding", filed Mar. 19, 1987 under Ser. No. 027,747, a system and method for reducing quantizing noise is disclosed in which an input analog signal is first pre-emphasized to accentuate its high frequency components. Samples of the signal are then taken and nonlinearly encoded to create a series of digital representations of the samples having a lower order resolution than the sample resolution. The differences between the samples and the corresponding lower order resolution digital representations are then obtained, and combined with the next sample prior to encoding. The encoded signal is then decoded in a complementary manner and converted to an analog format, followed by a complementary de-emphasis step to yield an output analog signal which closely approximates the original input signal. While this system is a distinct improvement, it still exhibits noticeable quantization noise in some circumstances.

SUMMARY OF THE INVENTION

Accordingly, it is an object of the present invention to provide a method and associated apparatus for digital/analog encoding and decoding which exceeds the dynamic range of prior devices while, at the same time, minimizes the audible effects of quantization noise.

It is another object of the present invention to provide a method and apparatus for digital/analog encoding and decoding which, while providing improved performance, does so in an efficient and economic manner.

It is yet a further object of the present invention to provide a method and apparatus for digital/analog encoding and decoding which is particularly adapted to audio signal encoding and decoding, is compatible with compact disk quality, and will reduce noise to a level acceptable to persons having stringent requirements.

These objects are realized in the present invention by generating a predicted value for a signal in a series of higher order input digital signals (such as 16 bit), comparing the predicted value with the input signal to obtain a differential quantity representing the difference between the two, and encoding the differential quantity to a lower order digital format (such as 8 bit) with an encoding transformation. The encoded differential quantity is decoded back to the higher order format with a decoding transformation that is substantially complementary to the encoding transformation. A new encoding transformation is then selected for the next input signal in the series, the resolution of the new encoding transformation being a function of the absolute value of the differential quantity just decoded. Finally, the decoded differential quantity is combined with the predicted value of the input signal just processed to substantially recover the original input signal.

In the preferred embodiment a series of encoding transformations are provided in the form of discrete lookup tables. The transformations have generally high resolutions for low differential quantities, and substantially lower resolutions for high differential quantities. The range of differential quantities for which a high resolution transformation is provided is progressively increased from table to table, while at the same time the absolute resolution within the high resolution range decreases from table to table. In this manner the encoding and decoding almost always takes place within a region of high resolution, with the effective resolution increasing as the actual signal approaches its predicted value.

Identical decoding sections are provided in the encoder and decoder to track one another. The encoder and decoder are also initialized in a common manner to assure proper tracking. Additional accuracy is achieved by comparing the actual values of the input signals with the values output by the encoder's decoding apparatus, and generating a residue signal which represents the difference between the compared signals. The residue signal is then combined with the next input signal in obtaining the differential quantity for that signal. The predicted signal values may be obtained by a simple linear projection of the decoded values for the current and the immediately preceding input signals, or by a more complex calculation.

Further features and advantages of the invention will be apparent to those skilled in the art from the following detailed description of a preferred embodiment, taken together with the accompanying drawings, in which:

DESCRIPTION OF THE DRAWINGS

FIGS. (1a) and 1(b) are block diagrams of the encoding and decoding portions of the present invention, respectively.

DETAILED DESCRIPTION OF A PREFERRED EMBODIMENT

A preferred embodiment of the present invention uses selected nonlinear digital lookup tables for encoding and decoding, with a digital prediction method and quantization noise spectral shifting accomplished by error carryforward. It is used to encode a higher order digital format, such as a 16 bit digital signal, to a lower order digital format, such as an 8 bit digital signal, and then recover the original higher order 16 bit input signal from the lower order signal.

Figure 1:
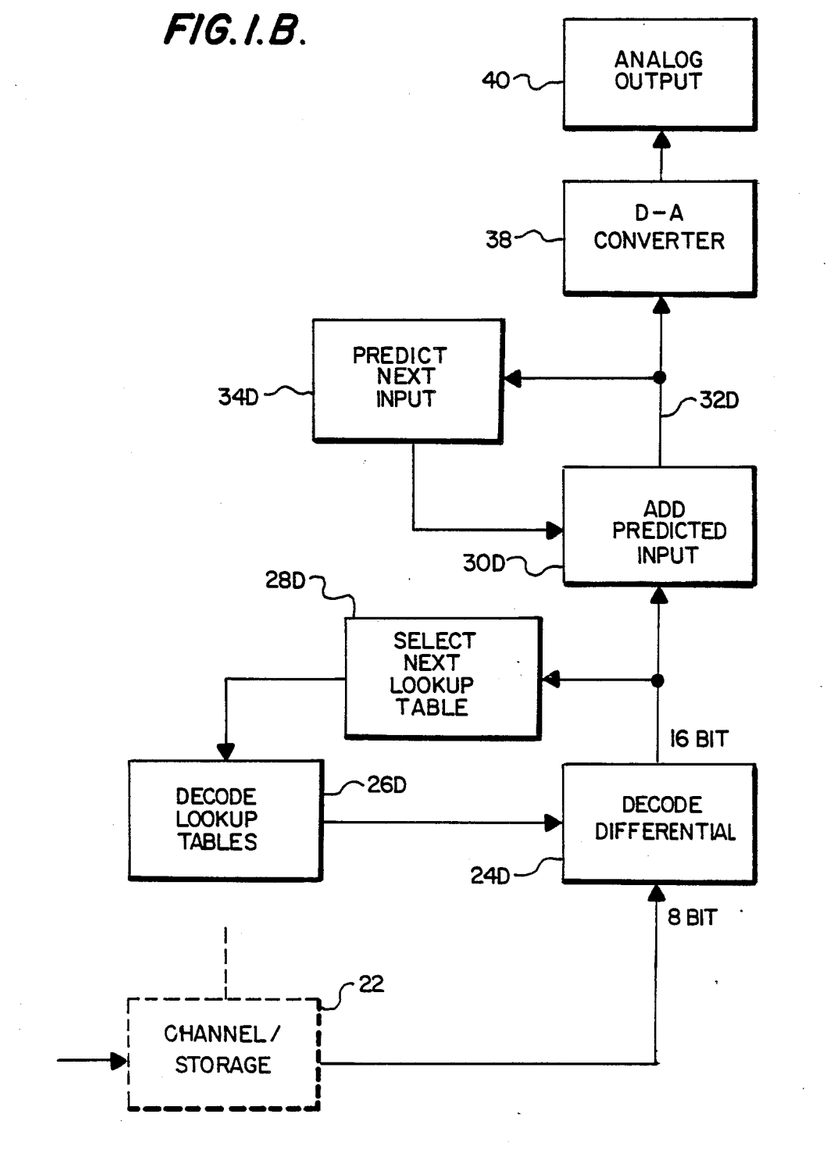
Figure 1A:
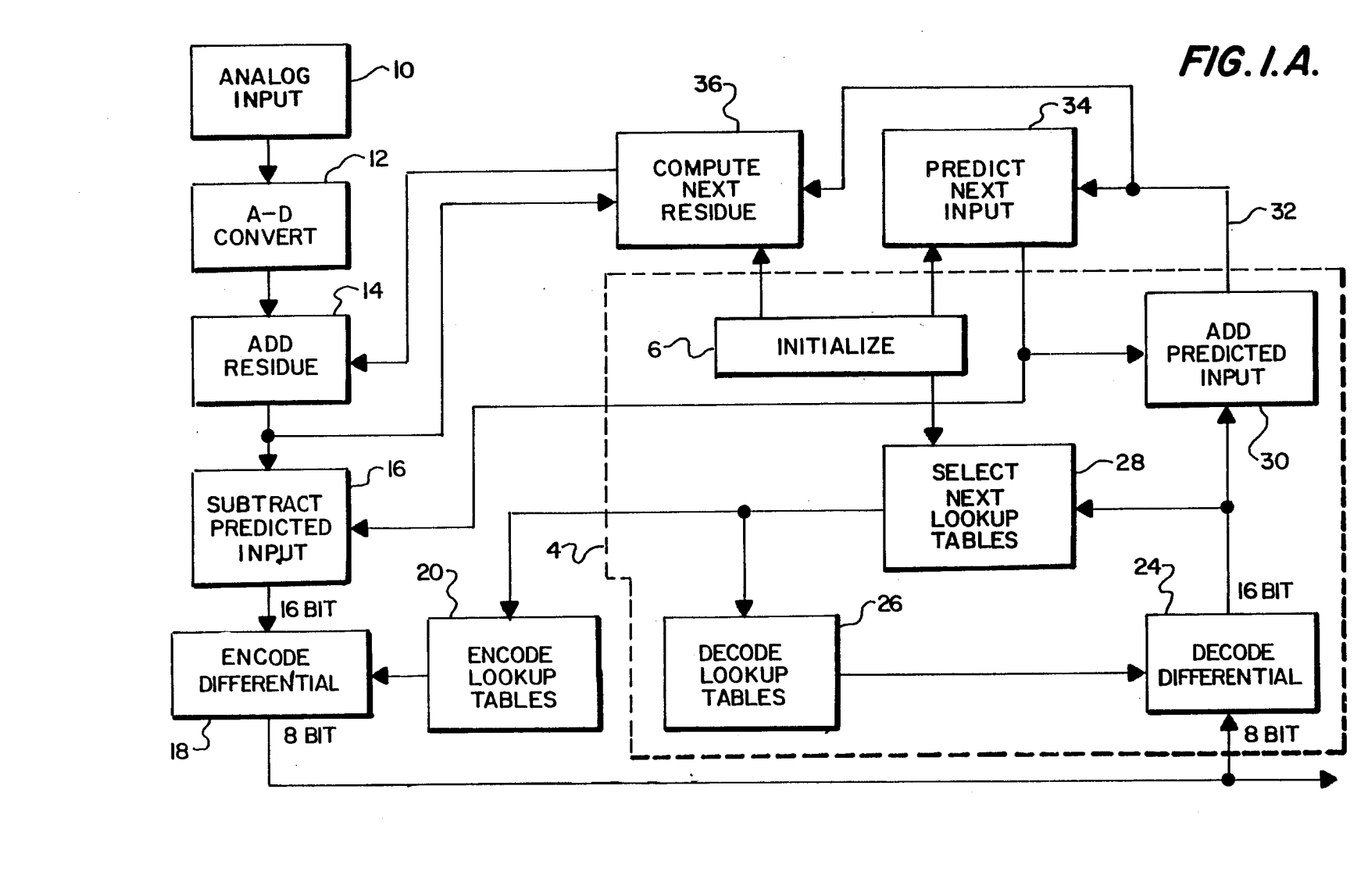

This is preferably accomplished with the use of a fully digital system such as that functionally depicted in the block diagram of FIGS. 1(a) and 1(b). For purposes of illustration, the invention will be described in connection with the encoding of a high resolution 16 bit linear representation data stream into an 8 bit encoded data stream, and the subsequent decoding of the signal back to a 16 bit high resolution data stream. The resulting digital signal is suitable for conversion to an output analog signal by a conventional 16 bit linear digital-to-analog converter.

An encoder is shown in FIG. 1(a) which converts 16 bit signals to an 8 bit format, while a decoder is shown in FIG. 1(b) which converts the 8 bit signals back to 16 bit. The encoder of FIG. 1(a) includes both an encoding section, and a decoding section enclosed by dashed line 4. The decoding section 4 within the encoder matches the decoder of FIG. 1(b), and ensures that the encoder and decoder properly track each other.

The encode and decode processes use a number of variables, three of which must be set before beginning the process. Initialization circuits 6 is provided in the encoder and another initialization circuit is provided in the decoder for this purpose. The three variables are the residue (R), predict (P) and table (T). R is the difference between the last decoded high resolution digital value provided from the decoder, and that same high resolution digital value prior to encoding. P is the system's prediction of the value of the next input signal, while T is a number telling the system which of the set of encode and decode transformation tables to use for the next sample look-up; the tables are discussed in further detail below. To initialize the system, R is set to zero, while P is set to a mid-range value, such as 32,767 for a 16 bit system. T is set to the table having the highest center resolution.

An analog input signal, which in the preferred implementation is an audio signal, is supplied by analog source 10 to an analog-to-digital converter 12, which converts it to a high order digital format such as 16 bits per analog sample. In block 14 the calculated residue from the previous signal sample is added to the current 16 bit word. A predicted value for the current signal is then subtracted in block 16; the manner in which the predicted value is generated is discussed below.

The result of the subtraction step in block 16 is referred to as the differential quantity. This quantity is supplied to a nonlinear encoder element 18, which encodes the 16 bit differential quantity into a lower order 8 bit digital format in accordance with a selected transformation lookup table from a set of lookup tables 20. Any desired number of different lookup tables may be provided; with a 16/8 bit system, 32 different lookup tables is a reasonable figure.

The resulting 8 bit encoded differential quantity is supplied to both the decoding section 4 within the encoder, and to the decoder. The signal may be delivered through a transmission channel, or stored for later decoding in a storage device 22. Within decoding section 4, the 8 bit differential quantity is transformed back to a 16 bit signal by 8/16 bit decoder 24. The decoding transformation used is provided from a set of decode lookup transformation tables 36, which are complementary to the encode lookup tables 20. The decoded differential quantity from decoding element 24 is then supplied to a selection block 28, which selects the proper complementary encode and decode lookup tables for the next input signal. As explained in further detail below, lookup tables are selected which have high resolution ranges corresponding to the value of the decoded differential quantity, so that the encoding and decoding resolution is optimized for each different signal.

The decoded differential quantity is also supplied to an adder circuit 30, which adds in a quantity that has been predicted for the current signal from previous signals. The output of this element on line 32 will normally either equal or closely approximate the original 16 bit input digital signal. This output is used in predictor 34 to predict the 16 bit value of the next input signal. In one embodiment predictor 34 uses a simple linear projection, in which the value of the next signal is predicted by subtracting the value of the previous signal from twice the value of the current signal. Other more complicated prediction functions might also be used if desired. The predicted value for the next input signal is supplied to both adder 30 and subtractor 16.

Because of the optimized resolution for both the encoding and decoding functions, the output signal on line 32 should closely approximate the original input signal. Additional accuracy can be obtained by comparing the output on line 32 with the actual input signal from which it was obtained, and using any difference (residue) to adjust the processing of the following signal. This is accomplished by a residue compute element 36, which subtracts the output on line 32 from the original input signal (after addition of the residue from the previous sample). The difference is delivered back to the encoding section, where it is added to the next input signal in block 14.

The decoder of FIG. 1(b) employs elements which are identical to the decoding section 4 within the encoder. The 8 bit encoded differential quantity is received and mapped back to a 16 bit format by decoder element 24D, which is supplied with the same lookup tables from a set of tables 26D as that used by decoding element 24. The 16 bit decoded differential quantity is employed by a table selector 28D to select the lookup table for the next input signal in the same manner as table selector 28. The same differential quantity signal is also supplied to an adder 30D, the output of which is used by a predictor circuit 34D to predict the value of the next 16 bit input signal, and to furnish the predicted value to the adder 30D, in the same manner as predictor 34. The final output on line 32D is supplied to a digital-analog-converter 38, which converts the signal to an analog output 40 that tracks the analog input 10 with a greater accuracy than has heretofore been attainable. Since the construction and operation of decoder shown in FIG. 1(b) matches that of decoding section 4 within the encoder, the same decode tables are used and the two systems are initialized in the same manner, the encoder and decoder will track exactly.

Figure 2:
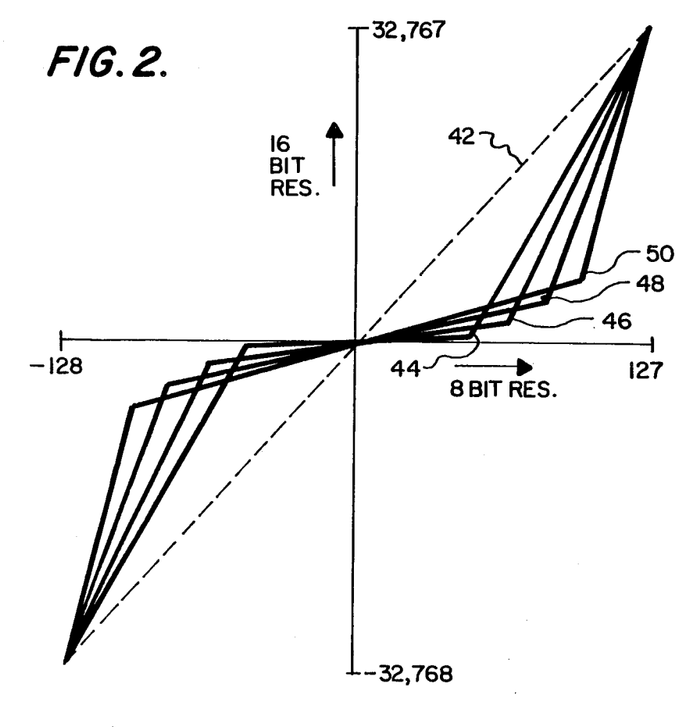
FIG. 2 is a simplified graph illustrating a range of digital transformations available with the invention.

FIG. 2 is a set of graphs which illustrate the type of encoding and decoding transformations made available with the invention. Only four transformation tables are shown, although as stated above thirty-two tables have actually been used in a 16/8 bit system. Also, the transformations are shown as consisting of straight line segments for ease of illustration, although in actual practice they would be curved.

For a linear transformation system, illustrated by dashed line 42, there is a constant scale throughout the entire operating range for mapping between 16 and 8 bit words. This is a simple straight line running through the origin. Typical companding curves used by the invention are indicated by curves 44, 46, 48 and 50. These curves have a higher degree of resolution near the origin than does linear curve 42, and a lower resolution further away from the origin. The degree of resolution is determined by the slope of the curve at any point, with a lower slope indicating a higher resolution. A lower slope means that, for any given 8 bit word, there are fewer possible 16 bit words to select from in the decoding. Curve 44 has the highest resolution near the origin, but also the smallest region of high resolution before its slope turns upward. This transformation curve 46 would be selected for small values of the differential quantity, since such values will lie within the restricted region of high resolution. Transformation curve has a somewhat lower resolution near the origin, but still much higher than linear transformation curve 42, and its region of high resolution extends to a greater value of the 8 bit differential quantity than in curve 44. Curve 46 is selected for differential quantities slightly outside the high resolution range of curve 44.

In a similar manner, transformation curve 48 has a somewhat lower resolution near the origin than curve 46, but a correspondingly greater high resolution range, while curve 50 has a lower resolution but higher range of high resolution than curve 48. These latter two curves would be selected for differential quantities that are slightly outside the high resolution ranges of the next lower curves. The transformation curve for any particular differential quantity will thus be selected such that its high resolution region encompasses the differential quantity, but does not extend much beyond that quantity. In this manner a close to optimum resolution can be selected for any particular differential quantity.

The differential quantity is an indicator of how much the actual input signal differs from the predicted value for that signal. Larger values of the differential quantity typically accompany a very rapidly changing input signal, and are matched to a transformation table having an extended high resolution region that encompasses the larger value. When the input signal is more predictable, on the other hand, the differential quantity will be quite small, and a transformation curve with a correspondingly more restricted region of high resolution is selected.

Figure 3:
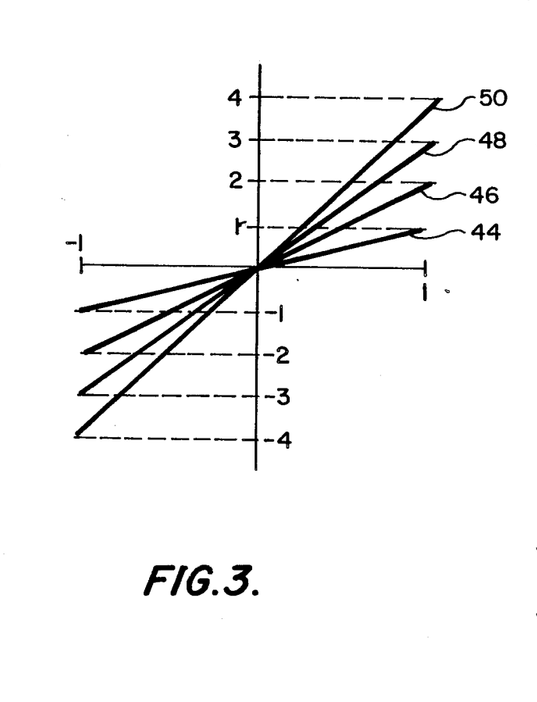
FIG. 3 is an expanded view near the origin of FIG. 2, to a different scale.

FIG. 3 is a blow-up of the portion of FIG. 2 near the origin, with an expanded vertical scale. For the highest resolution transformation curve 44, an 8 bit value of 1 is illustrated as corresponding to a 16 bit value of 1 (as opposed to a 16 bit value of 256 for a linear transformation). In this example there will be an exact mapping of the 8 bit encoded differential quantity into a 16 bit decoded value. Transformation curve 46 has half this resolution, with each 8 bit value corresponding to two 16 bit values. Since it is not known which of the two possible 16 bit values corresponds to the original 16 bit signal prior to encoding, a small ambiguity and possible error is present. This, of course, is still much less than in a linear system, where the ambiguity is 256:1.

Curves 48 and 50 represent slightly lesser degrees of resolution near the origin, of 1:3 and 1:4 in the 8/16 bit decoding. Thus, the ambiguity and possible error for these curves will be somewhat larger, although still much less than for a linear transformation.

Figure 4:
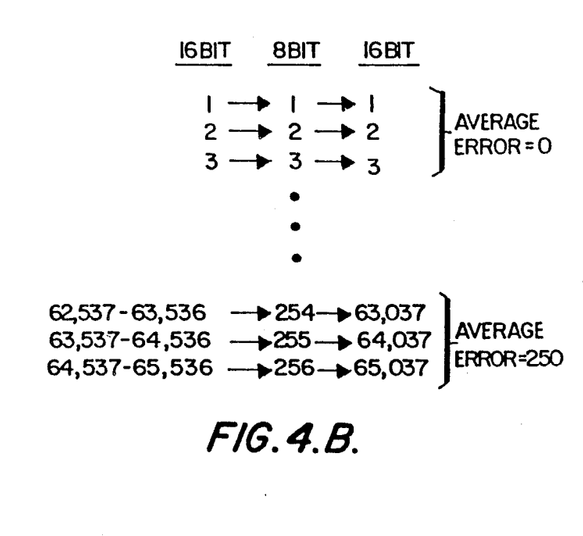
FIGS. 4(a) and 4(b) are charts comparing the encoding/decoding accuracy of a linear transformation with that of a representative transformation for the present invention.

Although the transformation curves 44–50 have regions of very low resolution at a distance from the origin, with a reasonable predictor function the vast majority of transformations will occur in the high resolution regions. Thus, although the average resolution for each of the transformation curves 44–50 is 1:256 over the entire curves, in operation the actual resolutions will be much higher. This is illustrated in tabular form in FIGS. 4(a) and 4(b). The use of a linear transformation curve to encode a 16 bit word into an 8 bit format, and then decode the word back to 16 bits, is illustrated in FIG. 4(a). All 16 bit words with values from 1–256 will be encoded into an 8 bit value of 1, all 16 bit words with a value from 257 to 512 will be encoded into an 8 bit value of 2, etc. In decoding the 8 bit value of 1, it will not be known which of the possible 256 16 bit words is the correct one. Accordingly, with a linear transformation an arbitrary selection of a 16 bit mid-range value of 128 would typically be made. Similar arbitrary mid-range values would be selected for the other 8 bit values, yielding an average 16 bit decode error of 64 (the average difference between 128 and each of the possible 16 bit values in the range 1–256).

By contrast, the results of the very high resolution transformation curve 44 are illustrated in FIG. 4(b). Since there is a 1:1 mapping between 8 and 16 bits near the origin, only one possible 16 bit decoded word corresponds to each 8 bit encoded word. Accordingly, the average error near the origin is zero. Towards the opposite end of the curve, by contrast, 1000 successive 16 bit values might be encoded, for example, into a single 8 bit value. Accordingly, there is a 1000:1 ambiguity in decoding the 8 bit word back into 16 bit format. The average error in this region will thus be 250, which is much higher than the average error for a linear transformation. However, since the vast majority of transformations will occur in the high resolution range, the actual error on average will be much less than for a linear transformation.

In accordance with the invention, transformation lookup tables are selected which have as high a resolution as possible over the region in which the next value to be encoded and decoded is expected to occur. This is done by looking at the magnitude of the previously decoded differential quantities. If the prediction has been accurate and the decoded differential quantity is accordingly small, a table with a very high resolution near the origin will be used. On the other hand, if the differential quantity is large, a table with a higher resolution range that extends out to the probable range of the next differential quantity to be encoded will be used, and the decoded value will necessarily on average be somewhat less accurate.

The table to be used in each encode/decode cycle in the preferred embodiment is determined from the magnitude of the decoded differential quantity outputted from decode blocks 24 and 24D (FIGS. 1(a) and 1(b)). If a differential quantity appears whose magnitude is outside the high resolution range of the current transformation table, a new table is selected for the next cycle whose high resolution range extends to this greater differential quantity. Various algorithms may be used to create the encode and decode mapping tables, including simple hand entry. The guiding principle in the design of the tables is to have the average mapping error be minimized, so as to minimize the resulting quantization noise. One way of viewing the design of the encode tables is that the 256 8 bit encoded values should be distributed according to the probability of occurrence of particular differential quantity values. If the predictor function is expected to be accurate, most of the samples will fall near the origin, and the density of 8 bit decoded values located near the origin should be high. On the other hand, if in the extreme all 65,536 possible 16 bit values for the differential quantity were equally likely, then the 256 encoded 8 bit values should be linearly distributed. In a sense, the form of the encode lookup table is a representation of the probability distribution of the expected difference between the input signal and the predicted value for that signal. Various noise criteria may be used in designing the form of the tables, and in sophisticated systems the tables may even be changed as the probability distributions and/or the predictor algorithm changes with experience. However, the basic principle remains the same.

The decode tables in blocks 26 and 26D are very simply determined from the encode tables of block 20. For a particular 8 bit value, the average of all 16 bit values mapping to that 8 bit value in the encoding table is taken as the 16 bit output of the decoding table for the same 8 bit value. Thus, the decode tables are uniquely determined by the encode tables, and are essentially complementary thereto.

Figure 5:
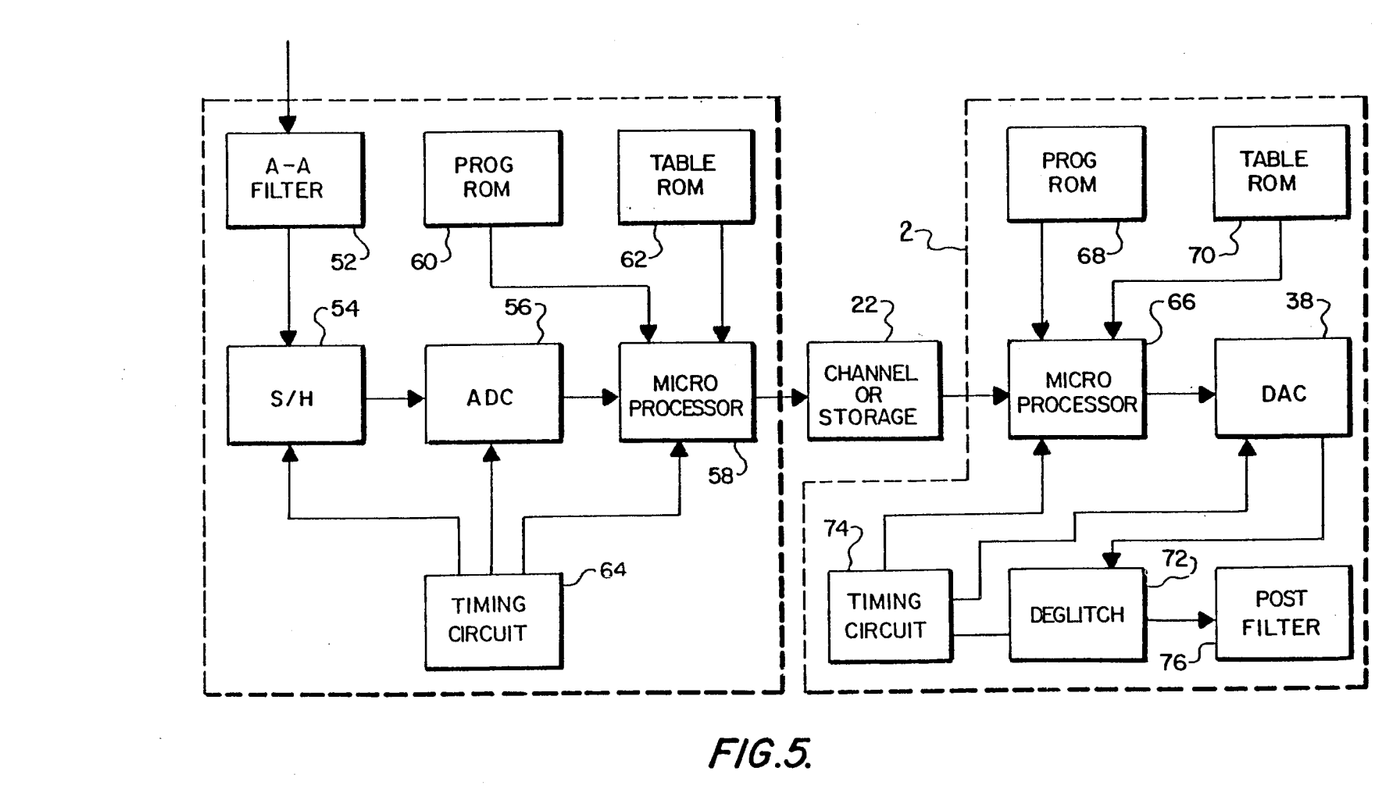
FIG. 5 is a block diagram showing the implementation of the invention with a microprocessor system.

FIG. 5 is a block diagram depicting the implementation of both the encoding and decoding functions using microprocessors. The input analog signal is delivered to an anti-aliasing filter 52, which passes to a sample and hold circuit 54 only those frequencies which are less than half the sample rate of circuit 54. The sampled analog output from circuit 54 is converted into a high resolution linear digital representation by analog-to-digital converter (ADC) 56. The output of ADC 56 is accessed by a microprocessor 58, which performs the sequence of steps shown in the block diagram flow chart of FIG. 1(a). Read only memory (ROM) 60 contains the program, while ROM 62 contains the encode and decode mapping tables described above. Microprocessor 58 has on-board random access memory (RAM) in the form of registers, which also provide memory used in the execution of the encode algorithm. The microprocessor outputs the encoded 8 bit representation of the differential quantity to either the data channel or digital storage means 22. Timing circuit 64 coordinates the sample and hold, ADC, encoding process and data output processes. The entire encoder is shown enclosed within a dashed line 1.

In the preferred embodiment the ADC 56 quantizes the input analog samples to 16 bit resolution, but the encoding process is able to retain the audio quality of that signal while outputting 8 bit resolution samples to channel 22. Thus, the channel capacity required to transmit the encoded analog signal is cut in half. For example, the present invention has been used to encode digital audio information for storage on erasable programmable read only memories (EPROMs). This form of data storage is highly reliable but very expensive, and the use of the invention for this application can cut the number of EPROMs needed to store digital audio in half, and thereby dramatically reduce the cost of such systems with no loss of audio quality.

The encoded differential quantity is passed from the channel or data storage device 22 to a microprocessor 66 in the decoder 2. ROM 68 holds the program for the decoding process, while ROM 70 holds the decode lookup transformation tables. Microprocessor 66 has on-board a small amount of RAM in the form of registers which are used in the conversion process. Microprocessor 66 outputs the recreated high resolution digital representation of the encoded analog signal to the DAC 38. The output of DAC 38 is passed to deglitcher circuit 72, which is essentially a sample and hold circuit that holds the last sample output from DAC 38 while the next value is settling. A timing circuit 74 coordinates the inputting of data from the channel, the decoding process, the DAC process and the operation of the deglitcher. The output of deglitcher 72 is filtered by a post filter 76 to remove all frequency components beyond those passed by the anti-aliasing filter 52 in the encoder. This filter also compensates for the Sinx/x aperture frequency loss and any pre-emphasis introduced in the encoders anti-aliasing filter 52.

FIGS. 6(a)-(d) are schematic diagrams of an actual implementation of the decoder described above, which is employed both in the decoding section 4 within the encoder, and in the decoder 2. The circuit utilizes a 68000 microprocessor CPU 78 ROM components 80 and 82 provide the program and mapping tables of ROMs 68 and 70 from FIG. 5. Data gate 84 directs 8 bit encoded data words from the channel to the microprocessor 78, while data gates 88 and 90 direct the decoded 16 bit data words to the DAC 38. Gate 86 directs the sample signal to the microprocessor 78 to indicate the presence of valid data to initiate the conversion process. A data bus port selector 92 is controlled by the microprocessor and determines which of the input or output devices is active.

Figure 6:
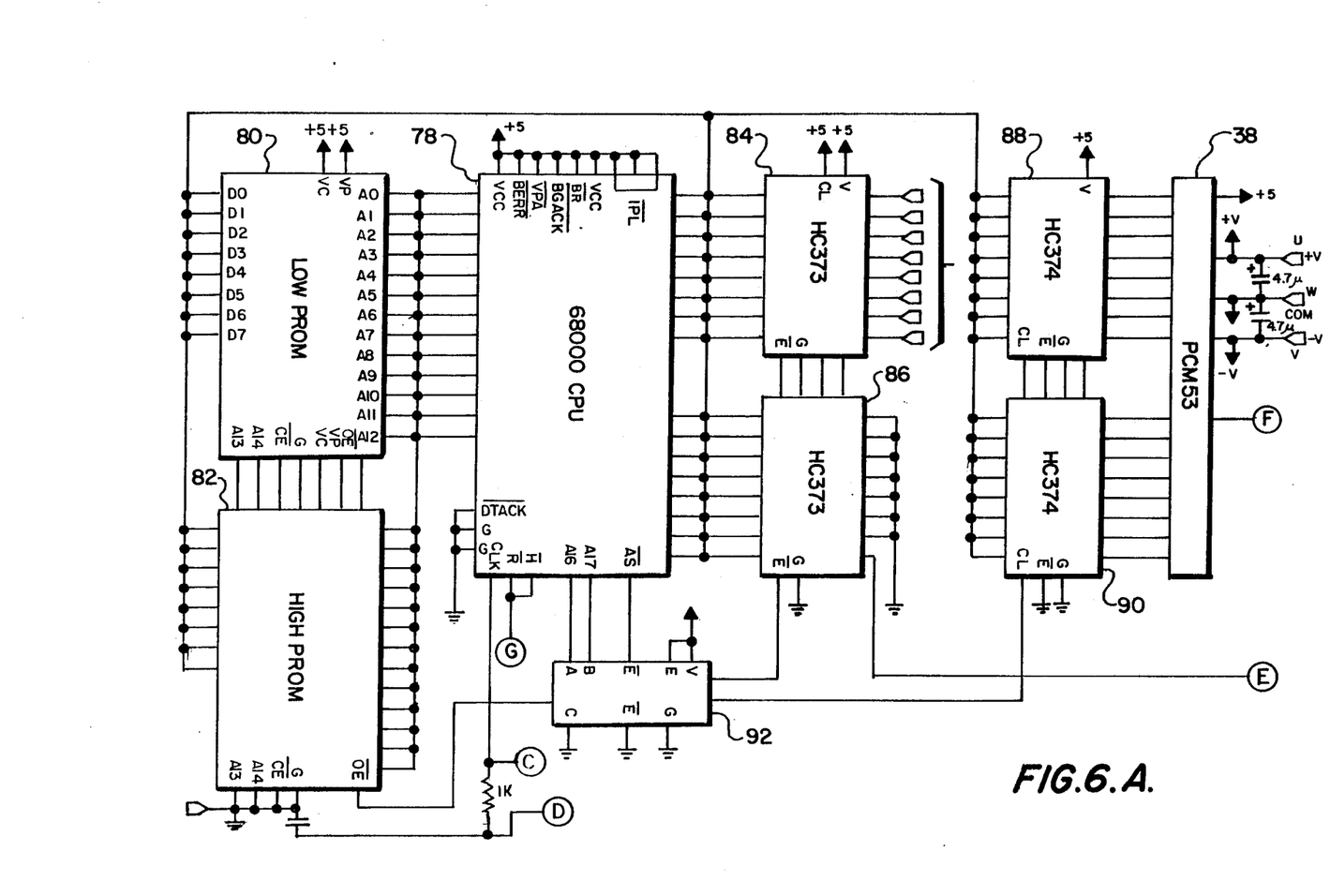
FIGS. 6(a), 6(b), 6(c), and 6(d) are schematic diagrams for different sections of the microprocessor system of FIG. 5.

Referring now to FIG. 6(b), an inverter 94 and an associated crystal 96 form the master clock for the system, and together with counter chip 98 comprise the timing circuitry. Control inputs 100 and 102 allow the system to be reset. A pause control 104 allows the clock to be inhibited, thereby pausing the operation of the system.

In FIG. 6(c), the deglitching circuit 72 of FIG. 5 is implemented by an amplifier 106 and associated circuitry. An input 108 signals the arrival of valid data. The post filter 76 is shown in FIG. 6(d), consisting of amplifiers 110-128 and associated circuitry.

A complete source code for operation of the preferred embodiment of the system is given at the end of this detailed description. It is written in standard 68000 assembly language, and is self-explanatory. The encoding and decoding processes may also be carried out using a conventional multi-purpose computer, such as an IBM AT personal computer. The algorithms are defined using a convenient programming language such as C or Basic. The digital data to be encoded is stored in the computer memory, usually on hard disks. In this case the digital representation is simply treated as a data file operated upon by the program, and the output of the encoding algorithm creates another data file. This is the compressed data representation which is loaded onto an intermediate storage medium such as an EPROM for subsequent decoding by an implementation of the decoder such as that shown in FIGS. 6(a)-(d), or by the computer acting a decoder.

Figure 7:
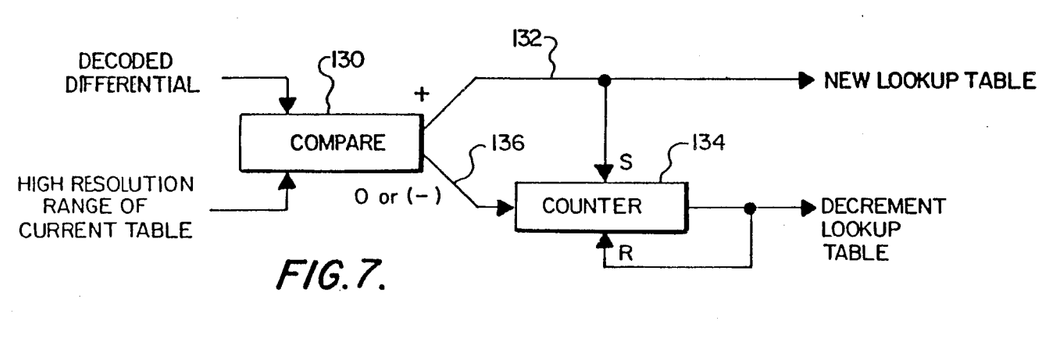
FIG. 7 is a block diagram illustrating the different responses of the system, depending upon whether or not the differential quantity exceeds the system's current high resolution range.

Referring now to FIG. 7, a flow diagram of the preferred manner of selecting the lookup tables is shown.

The table to be used in each encode-decode cycle is determined by looking at the magnitude of the decoded differential quantity from decode elements 24 and 24D in FIG. 1. This differential quantity is compared with the high resolution range of the current lookup table from which the differential quantity was obtained. If a decoded differential quantity appears which is outside the high resolution range of the current table, a new lookup table is selected with high resolution range extending to that differential quantity for the next cycle. The signal on line 132 also sets a counter 134 to a predetermined initial count (8 in the preferred embodiment). For each differential quantity which does not exceed the high resolution range of the current table, a signal is produced over line 136 to decrement counter 134 by 1. When the counter is decremented down to zero, the lookup table with the next lower high resolution range (and the next higher absolute resolution within said range) is selected, and the timing counter is reset to its original count. This procedure assures a timed change of the table select mechanism toward higher resolutions (near the origin) when low differential quantities are received over a period of time, and at the same time the algorithm assures an instant response to the receipt of a large differential quantity. These tables map all input 16 bit values to output 8 bit values and back again, so there is never an overload problem. When an unexpectedly high differential quantity is received, it is encoded to the nearest 8 bit encoded value which lies in the low resolution region of the current table. However, for the very next sample a new table will have been selected having a greater high resolution range which extends to differential quantities of this magnitude. Thus, the period of any low resolution operation is strictly limited to a minimal amount.

While a particular embodiment of the invention has thus been shown and described, numerous variations and alternate embodiments will occur to those skilled in the art. Accordingly, it is intended that the invention be limited only in terms of the appended claims.

```
; HQ.SRC 11-20-87
; 68000 HQ Digital Audio

; Memory Configuration
; 0 to 16384 is ROM
; 0 to 512 is Program
; 512 to 16383 is Differential Table
; 16384 is Sample Input      1 Byte
; 32768 is Sample Output     1 Word
; 65536 is Sample Status     1 Bit ; Register equates
; work                 D0 is working register
; decode               D1 is decode
; decode1              D2 is decode1
; delta                D3 is delta
; predict              D4 is predict
; width                D5 is width
; count                D6 is count
; zero                 D7 is zero
; dif_tbl              A0 is Dif_Tbl
```

```
            ; Memory mapped I/O locations
    INPUT EQU      $10000         ; Incoming data Byte
    STATUS EQU     $20000         ; Outgoing data Word
    OUTPUT EQU     $40000         ; Status data Byte ; Code section
            ORG    $0             ; Vector Area DC.W   0              ; Initial Strack Pointer
            DC.W   $2000          ;
            DC.W   0              ; Start Address
            DC.W   START          ;

; Initialize Variables
    START:  MOVE.L  #512,A0       ; Get Differential Table
            MOVE.L  #0,D1         ; Init Decode value
            MOVE.L  #0,D2         ; Init Decode1 value
            MOVE.L  #32768,D3     ; Init Delta value
            MOVE.L  #128,D4       ; Init Predict value
            MOVE.L  #0,D5         ; Init Width value
            MOVE.L  #16,D6        ; Init Count value
            MOVE.L  #0,D7         ; Init Zero reference
            MOVE.L  #$8000,A1     ; Init D/A value
            MOVE.W  A1,OUTPUT     ; Init D/A ; Main Program
    LOOP:   BTST.B   #0,STATUS    ; Sample ready?
            BNE.S    LOOP         ; Wait for Trigger
            MOVE.W   A1,OUTPUT    ; Output Value ; Compose Delta and Width
    S1:     MOVE.B   D5,D0        ; Get width
            LSL.W    #8,D0        ; Shift left 8 bits
            ADD.W    INPUT,D0     ; Add the input value
            LSL.W    #1,D0        ; Times 2
            MOVE.W   0(A0,D0),D3  ; Get the Delta value ; Adjust Width and Count
    S2:     MOVE.W   D3,D0        ; Get High Byte
            LSR.W    #8,D0        ; Adjust Delta
            BTST.B   #7,D0        ; Get Sign Magnitude
            BEQ.S    S21          ; Already OK
            NOT.B    D0           ; One's complement
            ADDQ.B   #1,D0        ; Add one ; Extract New width from Delta
    S21:    LSR.B    #1,D0        ; Limit to 7 Bits
            CMP.B    D0,D5        ; Is Delta >=Width?
            BGE.S    S22          ; ->No
            MOVE.W   D0,D5        ; New Width
            MOVEQ    #8,D6        ; Set Count
            CMPI.B   #30,D5       ; Limit Width
            BLE.S    S3           ; -> Its OK
            MOVEQ    #30,D5       ; Set Width
            BRA.S    S3           ; All done ; Check and Adjust Count
```

```
S22:    CMP.B   D7,D6           ; Is count 0?
        BEQ.S   S23             ; ->Yes
        SUBQ.B  #1,D6           ; Decrement Count
        BRA.S   S3              ; All done ; Check and Adjust Width
S23:    CMP.B   D7,D5           ; Is Width = 0?
        BEQ.S   S3              ; ->Yes
        SUBQ.B  #1,D5           ; Decrement Width
        MOVEQ   #8,D6           ; Set Count ; Calculate new Decode value
S3:     ADD.W   D3,D4           ; Get Predict by Delta
        MOVE.W  D4,D1           ; Save value
        MOVE.W  D1,A1           ; Send it out ; Calculate new Predict
S4:     ADD.W   D1,D4           ; Two times Decode
        SUB.W   D2,D4           ; Compute new Predict ; Save value for next time through
S5:     MOVE.W  D1,D2           ; Save last value S6:     BRA.S   LOOP            ; Go for next sample
```

I claim:

1. A method of encoding a series of input digital signals in a higher order digital format to a series of lower order digital signals and then recovering the original input digital signals from the lower order signals, comprising:
generating a predicted value for an input signal in said series,
comparing said predicted value with said input signal to obtain a differential quantity representing the difference between the two,
encoding said differential quantity to a lower order digital format with an encoding transformation,
decoding the encoded differential quantity to said higher order format with a decoding transformation that is complementary to said encoding transformation,
selecting an encoding transformation for the next input signal in the series, the resolution of said encoding transformation being a function of the absolute value of the differential quantity just decoded, and
combining said predicted value with the value of said decoded differential quantity to recover said original input signal.

2. The method of claim 1, wherein the selected encoding transformation has a high resolution over a range of low differential quantities and a lower resolution for higher differential quantities, absolute resolution within said high resolution range decreasing as the range increases.

3. The method of claim 2, wherein the high resolution range of the encoding transformation is increased for an increase in the differential quantity beyond the current high resolution range, but is periodically decreased over a plurality of successive input signals in the absence of an increase in the differential quantity.

4. The method of claim 2, wherein said encoding and decoding transformations are selected from complementary sets of lookup tables, successive lookup tables for the encoding transformations having progressively greater high resolution ranges and progressively lower absolute resolutions within said high resolution ranges.

5. The method of claim 4, wherein an encoding lookup table is selected which has an increased high resolution range for an increase in the differential quantity beyond the high resolution range of the current lookup table, but in an absence of such an increase in the differential quantity the high resolution range of the selected encoding lookup table is reduced by predetermined decrements at a periodic rate over a plurality of successive input signals.

6. The method of claim 2, further comprising the step of initializing the encoding and decoding for an initial input signal by selecting a transformation with a minimum high resolution range but maximum absolute resolution within said range for an initial input signal.

7. The method of claim 6, further comprising the initializing step of selecting a predicted value within the midrange of expected input signal values for an initial input signal.

8. The method of claim 1, said transformations having high and low resolution ranges, wherein the resolution of said transformations within said ranges generally decreases with increasing values of differential quantity.

9. The method of claim 8, wherein the high resolution ranges of said transformations extend over differential quantity ranges which increase as the absolute resolution decreases.

10. The method of claim 9, wherein encoding transformations with greater high resolution ranges and lower absolute resolutions within said ranges are selected for greater values of the differential quantity.

11. The method of claim 1, wherein the steps of generating said predicted value, decoding the encoded differential quantity and adding said predicted value to the value of said decoded differential quantity are performed at both an encoding station and at a decoding station, the decoded differential quantity is used at the encoding station to select the encoding transformation for the next input signal and at the decoding station to select a complementary decoding transformation, and the combination of said predicted value and said decoded differential quantity is used at the encoding station to generate a predicted value for at least one subsequent input signal, and at the decoding station to generate the same predicted value as at the encoding station and to recover said input signal, thereby maintaining complementary encoding and decoding and tracking of said encoding and decoding stations.

12. The method of claim 11, further comprising the step of comparing the predicted value of the next input signal with its actual value to generate a residue signal representing the difference between the compared signals, and combining said residue signal with the next input signal in obtaining the differential quantity for said next input signal.

13. The method of claim 1, wherein said predicted value for a higher order digital signal is obtained by linearly projecting the decoded values of the current and the immediately preceding input signals.

14. The method of claim 1, further comprising the steps of periodically sampling an input analog signal to obtain said input digital signal, and transforming said recovered digital signal to an analog format to recover said input analog signal.

15. Apparatus for encoding a series of input digital signals in a higher resolution format to a series of lower order digital signals and then recovering the original input signals from the lower order signals, comprising:
a) an encoder comprising an encoding section and a decoding section,
(1) said encoding section comprising:
  i) means for comparing the predicted value of an input signal from said input signal to obtain a differential quantity representing the difference between the two,
  ii) means for providing a plurality of encoding transformations for encoding said differential quantity to a lower order digital format, said encoding transformations having high resolutions over respective ranges of low differential quantities and lower resolutions over respective ranges of high differential quantities, the high resolution ranges of successive transformations progressively increasing and the absolute resolutions of successive transformations within their respective high resolution ranges progressively decreasing, and
  iii) means for encoding said differential quantity with a selected one of said encoding transformations,
(2) said decoding section comprising:
  i) means for providing a plurality of decoding transformations which are complementary to said encoding transformations for decoding said encoded differential quantity to said higher order digital format,
  ii) means for decoding said encoded differential quantity with one of said decoding transformations which is complementary to the encoding transformation used in the encoding section,
  iii) means responsive to the decoded differential quantity for selecting an encoding transformation and a complementary decoding transformation for the next input signal which have high resolution ranges corresponding to said decoded differential quantity,
  iv) means for combining a predicted value of the input signal with the decoded differential quantity to produce an output signal,
  v) means for predicting the value of the next input signal from said output signal, and
  vi) means for supplying said predicted value to said comparing means in the encoding section, and to said combining means in the decoding section for combination with the next decoded differential quantity, and
b) a decoder comprising:
  i) means for providing a plurality of decoding transformations identical to the decoding transformations of the encoder's decoding section,
  ii) means for decoding said encoded differential quantity from the encoder with a decoding transformation identical to the decoding transformation used in the encoder's decoding section,
  iii) means responsive to the decoded differential quantity in the decoder for selecting a decoding transformation for the next input signal which is identical to the decoding transformation selected by the encoder's decoding section,
  iv) means for combining a predicted value of the input signal with the decoded differential quantity to produce an output signal which recovers the input signal and is equal to the output signal from the encoder's decoding section,
  v) means responsive to said output signal for computing the predicted value of the next input signal equal to the value predicted by the encoder's decoding section, and
  vi) means for supplying said decoder predicted value to said combining means in the decoder for combination with the next decoded differential quantity.

16. The apparatus of claim 15, wherein said encoding transformations are stored in a set of lookup tables, and the decoding transformations for the encoder's decoding section and for the decoder are stored in respective sets of lookup tables which are substantially complementary to said encoding lookup tables.

17. The apparatus of claim 16, said means for selecting an encoding transformation comprising means for selecting an encoding lookup table which has an increased high resolution range for an increase in the decoded differential quantity, but in the absence of such an increase in the decoded differential quantity selects an encoding lookup table having a high resolution range which is reduced by predetermined decrements at a periodic rate over a plurality of successive input signals.

18. The apparatus of claim 15, said encoder further comprising means for comparing the predicted value of the next input signal with its actual value to generate a residue signal representing the difference between the compared signals, and means for combining said residue signal with said next input signal in obtaining the differential quantity for said next input signal.

19. The apparatus of claim 15, said means for predicting the value of the next input signal comprising means for linearly projecting the decoded values of the current and the immediately preceding input signals.

20. The apparatus of claim 15, further comprising means for periodically sampling an input analog signal to obtain said input digital signal, and means for transforming the decoder's output signal to an analog format to recover said input analog signal.

* * * * *